United States Patent [19]
Fischer

[11] Patent Number: 5,283,950
[45] Date of Patent: Feb. 8, 1994

[54] APPARATUS FOR RECEIVING AND DELIVERING OBJECTS AND METHOD OF USING SUCH APPARATUS

[75] Inventor: Bruno Fischer, Dietikon, Switzerland

[73] Assignee: Siemens Aktiengesellschaft, Munich, Fed. Rep. of Germany

[21] Appl. No.: 541

[22] Filed: Jan. 4, 1993

Related U.S. Application Data

[63] Continuation of Ser. No. 755,647, Sep. 6, 1991, abandoned.

[30] Foreign Application Priority Data

Sep. 14, 1990 [CH] Switzerland ............... 02996/90

[51] Int. Cl.$^5$ ............................................. H01R 43/00
[52] U.S. Cl. ............................................. 29/884; 29/747; 198/459; 414/226; 414/753
[58] Field of Search ............... 29/747, 748, 881, 884, 29/876; 198/345.2, 346.2, 458, 459, 468.3; 414/226, 753

[56] References Cited

U.S. PATENT DOCUMENTS

| | | | |
|---|---|---|---|
| 3,987,889 | 10/1976 | Godoy | 198/458 |
| 4,199,050 | 4/1980 | Moller | 198/468.3 |
| 4,336,874 | 6/1982 | Kamphues | 198/458 |
| 4,360,100 | 11/1982 | Kamphues | 198/458 |
| 4,588,070 | 5/1986 | Smith | 198/468.3 |
| 4,694,951 | 9/1987 | Gibbemeyer | 198/468.3 |
| 4,832,180 | 5/1989 | Ferrero | 198/468.3 |
| 4,892,183 | 1/1990 | Fenton | 198/468.3 |
| 4,911,598 | 3/1990 | Sarvary et al. | 198/468.3 |
| 5,102,287 | 4/1992 | Johnson et al. | 414/753 |

FOREIGN PATENT DOCUMENTS

| | | | |
|---|---|---|---|
| 2950460 | 6/1980 | Fed. Rep. of Germany | |
| 111315 | 8/1980 | Japan | 198/468.3 |
| 190110 | 10/1984 | Japan | 198/468.3 |

*Primary Examiner*—Carl E. Hall
*Attorney, Agent, or Firm*—Sandler Greenblum & Bernstein

[57] ABSTRACT

The apparatus enables grasping a predetermined number of objects infed in a row and placing the grasped objects into a row arrangement containing a predetermined spacing from one another. There are provided tools containing displaceable object carriers and non-displaceable object carriers. The objects which are present in a predetermined pattern spacing are received by one of the tools and transferred to the object carriers of another one of the tools. By shifting the object carriers the objects are placed in a desired pattern having a predetermined pattern spacing, then transferred to the one tool and further processed by such one tool. The apparatus is particularly suitable, for instance, for the mounting of contact elements in insulating bodies of plug and socket connectors.

18 Claims, 5 Drawing Sheets

APPARATUS FOR RECEIVING AND DELIVERING OBJECTS AND METHOD OF USING SUCH APPARATUS

This application is a continuation of application Ser. NO. 07/755,647, filed Sep. 6, 1991, now abandoned.

BACKGROUND OF THE INVENTION

1. Field of the Invention

The present invention broadly relates to a new and improved apparatus for receiving and delivering objects and to a method of using such apparatus. In its more specific aspects, the apparatus of the present development serves for receiving objects arranged in a first pattern and delivering such objects arranged in a second pattern.

2. Discussion of the Background and Material Information

In different fields of application of automatic series or mass production, there frequently exists the problem of removing objects from an infeed or delivery device within an operating cycle and to deliver a predetermined number of such objects to a subsequent processing station. A typical field of application is the fitting of components of electro-technical products with connection elements which serve for the production of electrical connections with other components. Thus, for example, printed circuit boards or plug and socket connectors must be fitted with a multiplicity of metallic contact elements which are soldered or pressed into openings provided for this purpose. As a general rule, the contact elements or contacts are infed upon bands, removed from such bands and delivered for further processing.

In German Published Patent No. 2,950,460, published Jun. 26, 1980, there is disclosed an apparatus for the insertion of connection pins into a workpiece. A clamping device removes the connection pins from a carrier or support strip and individually delivers the connection pins to an insertion device. Only one connection pin after the other can be inserted into the workpiece. When confronted with large scale series or mass production of plug and socket connectors or the like, this technique no longer affords economically acceptable production times.

It is also known to the art to completely fit individual contact rows of plug and socket connectors during one working operation, that is to say, to simultaneously provide all of the contact positions of a row with a contact element. In many fields of application not all of the contact elements are required. This results in the need to fit the actually required position with a contact element during the production operation, so that there can arise different "patterns" of the contact occupancy.

In the prior filed, commonly assigned, copending U.S. application Ser. No. 07/634,214, filed Feb. 1, 1991 (herein "the commonly assigned apparatus"), entitled "Device For Handling Objects and Use of Said Device", the disclosure of which is incorporated herein in its entirety by reference, there is disclosed an apparatus or device where not only a plurality of objects are simultaneously grasped, but additionally, placed in a freely selectable mutual spacing from one another and in that condition can be thereafter delivered for further processing. This commonly assigned apparatus enables simultaneously incorporating a random number of objects into a processing or operating cycle, and the number of objects and their mutual spacing from one another can be freely selected within a predetermined pattern or array as a function of the momentarily encountered requirements. The pattern resolution is chosen such that each desired pattern, that is, every desired arrangement of the objects can be produced. As a result, it is possible in a very simple manner, for instance, in the previously mentioned specific field of application, to fit the rows of contacts or contact elements of plug and socket connectors according to a random desired pattern or configuration, that is to say, to also selectively leave predetermined or random desired contact positions devoid of contacts. The use of this commonly assigned apparatus renders possible, especially in the case of random patterns, to simultaneously prepare a set or package of contact elements corresponding to the desired contact element pattern, so that this previously prepared set of contact elements can be conjointly mounted, during a single operation, in appropriate openings of a carrier or support. In contrast to other mounting or fitting methods, the mounting or fitting method which can be performed with this commonly assigned apparatus results in an appreciable reduction in the time required for mounting or fitting of the contact elements.

It is to be mentioned, however, that such type of apparatus is not capable of withstanding too great mechanical loads. Thus, upon breakdown of such apparatus there results an appreciable downtime in the fabrication operation, usually accompanied by expensive repair work. Defects tend to especially occur during insertion or pressing-in of the objects into a body member. Thus, clamps or tongs which are used, for instance, in such apparatus for the handling of contact elements, are bent by the high thrust or pushing forces which arise when pressing these contact elements into the insulating body member of a plug and socket connector. As a result, it is not possible to precisely mount further contacts or contact elements. Moreover, the commonly assigned apparatus is itself even then subjected to load when the objects are only grasped and again delivered or outfed however, not mutually shifted with respect to one another.

SUMMARY OF THE INVENTION

Therefore, with the foregoing in mind, it is a primary object of the present invention to provide an improved apparatus for receiving and delivering objects and to a method of using such apparatus which is not subjected to the heretofore discussed drawbacks and limitations of the prior art.

Another and more specific object of the present invention aims at providing an improved apparatus for receiving and delivering objects which can be successfully employed for different fields of application, which contains at least one previously mentioned commonly assigned apparatus and by means of which there can be simultaneously grasped or engaged a plurality of objects and such placed in a freely selectable mutual spacing from one another, and thereafter these objects are delivered for further processing in a manner such that even with the occurrence of high mechanical forces in all likelihood there do not arise any defects, especially defects at expensive parts or components of the apparatus.

Still a further noteworthy object of the present invention and in keeping with the immediately preceding object concerns the provision of an improved apparatus for receiving and delivering objects wherein, in the event that a defect nonetheless arises, for example, due to faulty manipulation of an object, such defect can be eliminated in a relatively inexpensive manner without there arising any appreciable downtime in the apparatus and the production.

Yet a further significant object of the present invention aims at the provision of an improved apparatus of the forementioned type which enables receiving objects from different receiving locations or sites and delivering objects to different delivering locations or sites.

An additional important object of the present invention is to provide an improved apparatus for receiving and delivering objects, wherein, in those cases where the objects are only to be engaged and again delivered, but not mutually shifted with respect to one another, there then does not exist the requirement of using the commonly assigned apparatus.

Now in order to implement these and still further objects of the present invention, which will become more readily apparent as the description proceeds, the apparatus for receiving and delivering objects of the present development is manifested, among other things, by the features that there is provided at least one tool equipped with mutually non-displaceable object carriers for receiving, fixedly holding and again delivering objects and at least one tool equipped with mutually displaceable object carriers for receiving, fixedly holding and again delivering objects. The at least one tool equipped with mutually displaceable object carriers is structured for directly receiving objects from at least one receiving location and/or for directly receiving or taking over the objects from the at least one tool equipped with mutually non-displaceable object carriers. Furthermore, the at least one tool equipped with mutually non-displaceable object carriers is structured for directly receiving the objects from at least one receiving location and/or for directly receiving or taking-over the objects from the at least one tool equipped with the mutually displaceable object carriers and for the delivery of the objects to the at least one tool equipped with the mutually displaceable object carriers and/or to at least one delivery location.

According to a further aspect of the invention, there is provided at least one infeed device which transports the objects arranged in the first pattern to a receiving location, or there is provided a dispensing device which manipulates the objects in such a manner that the objects are prepared for delivery individually and in a desired number, and there are provided body members to which there can be delivered the objects arranged at the second pattern.

It is further contemplated by the present invention that with the same pattern spacings or with pattern spacings which differ from one another by an integer multiple, the object carriers of the at least one tool provided with mutually non-displaceable object carriers are arranged at a pattern spacing which is smaller by an integer multiple or at the same pattern spacing as the smaller pattern spacing of the two pattern spacings.

When there are present different or unequal pattern spacings, then the at least one tool provided with mutually non-displaceable object carriers comprises at least two regions or zones containing object carriers which are respectively arranged at the two different pattern spacings, or in a pattern spacing which is smaller by a predetermined multiple, or that there are provided at least two tools arranged at the respective pattern spacings or in a pattern spacing which is smaller by an integer multiple.

As to a further feature of the present invention, the tools containing the mutually non-displaceable object carriers are displaceably and/or rotatably arranged between the receiving locations as well as between at least one of the receiving locations and one tool containing the mutually displaceable object carriers and further at least with respect to one delivery location.

Moreover, the invention additionally contemplates that the object carriers of at least one tool form a one-piece or integral unit.

The bodies or body members equipped with objects, such as the contacts or contact elements, can be delivered to at least one further device serving for the reception and delivery of objects.

It is possible to arrange the tools upon one or a number of displaceable- and/or elevatable- and/or rotatable bodies.

The method of using the apparatus of the present invention contemplates transposing objects present in a first pattern into a second pattern and mounting such objects at a body. The objects to be mounted or fitted may comprise mechanical or electrical components which are mounted in a component carrier. In particular, the objects may comprise contact elements which are fitted, as by mounting or by pressing-in, into an insulating body of a plug and socket connector.

As previously indicated, the apparatus of the present development enables simultaneously incorporating a random desired number of objects into an operating or working cycle, and the number of objects and the mutual spacing of the objects from one another can be freely selected within a predetermined pattern corresponding to the momentary requirements. Expensive parts or components of the apparatus are not subjected to pronounced loads. The parts or components of the apparatus which are exposed to high loads, in the event that, for instance, after longer operating times defects should nonetheless arise, can be rapidly repaired or replaced with minimum expenditure. Additionally, the apparatus is quite flexible or versatile in use, since objects can be taken-up or received, in part even simultaneously and can be delivered to different locations. In the event the objects need only to be grasped and again delivered or deposited, that is, the objects need not be mutually shifted or displaced with respect to one another, then there can be dispensed with the need to use the relatively complicated commonly assigned apparatus. Mechanical loading of the commonly assigned apparatus is thus appreciably reduced. Additionally, the costs of producing the apparatus of the present development are comparatively modest, since with the employment of a single commonly assigned apparatus there can be attained the previously described operational flexibility or versatility.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Describing now the drawings, it is to be understood that only enough of the construction of the apparatus for receiving and delivering objects and the related structure have been depicted therein, in order to simplify the illustration, as needed for those skilled in the art to readily understand the underlying principles and concepts of the present invention.

Figures 1, 1A:
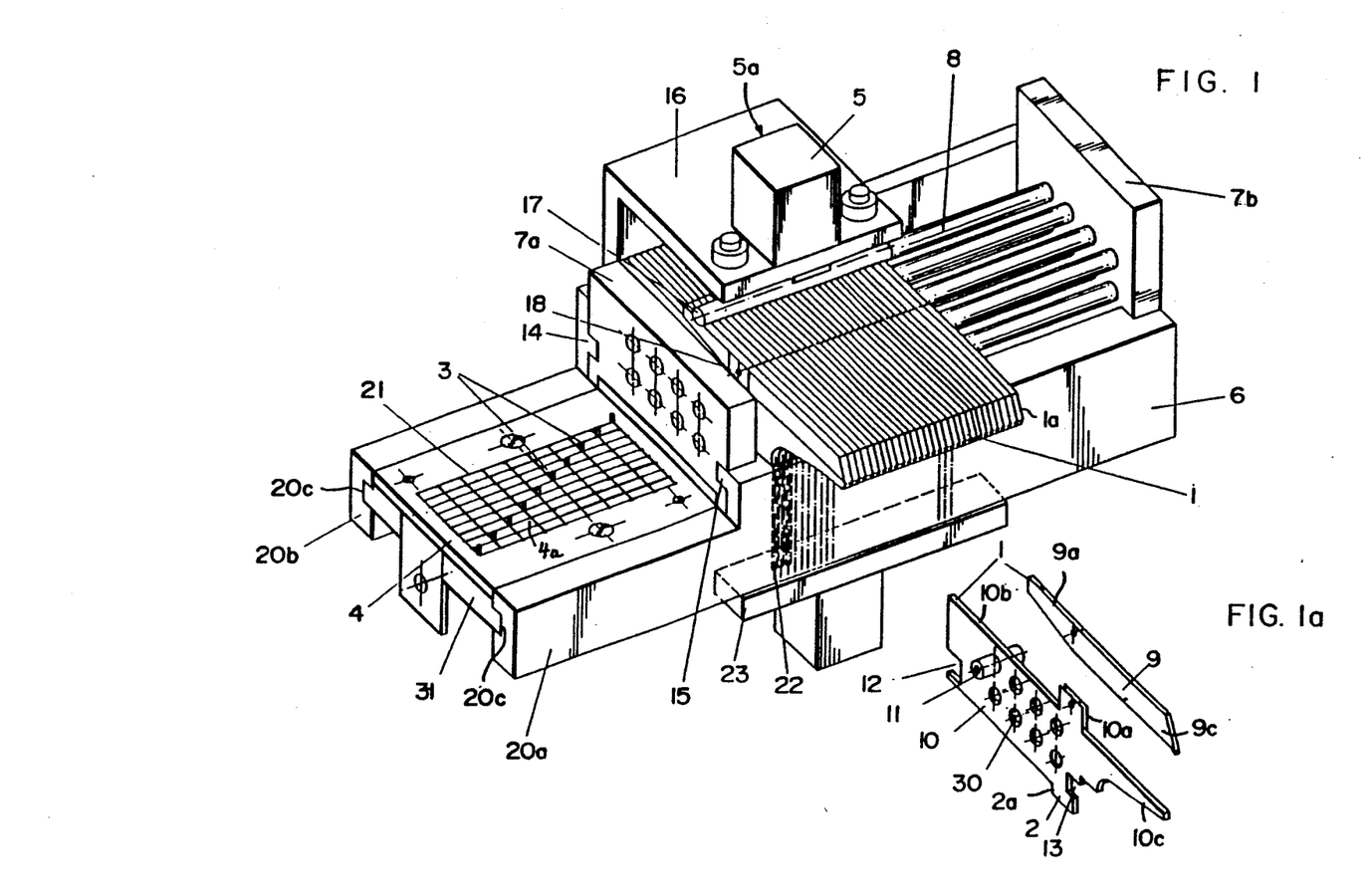
FIG. 1 schematically illustrates an apparatus for receiving and delivering objects and equipped with selectively displaceable object carriers or supports and constituting the commonly assigned apparatus disclosed in the previously mentioned commonly assigned, copending U.S. application Ser. No. 07/634,214, filed Feb. 1, 1991.
FIG. 1a is an enlarged exploded detail view of one of the clamps or tongs defining an object carrier or support and used in the apparatus of FIG. 1.
Figure 2:
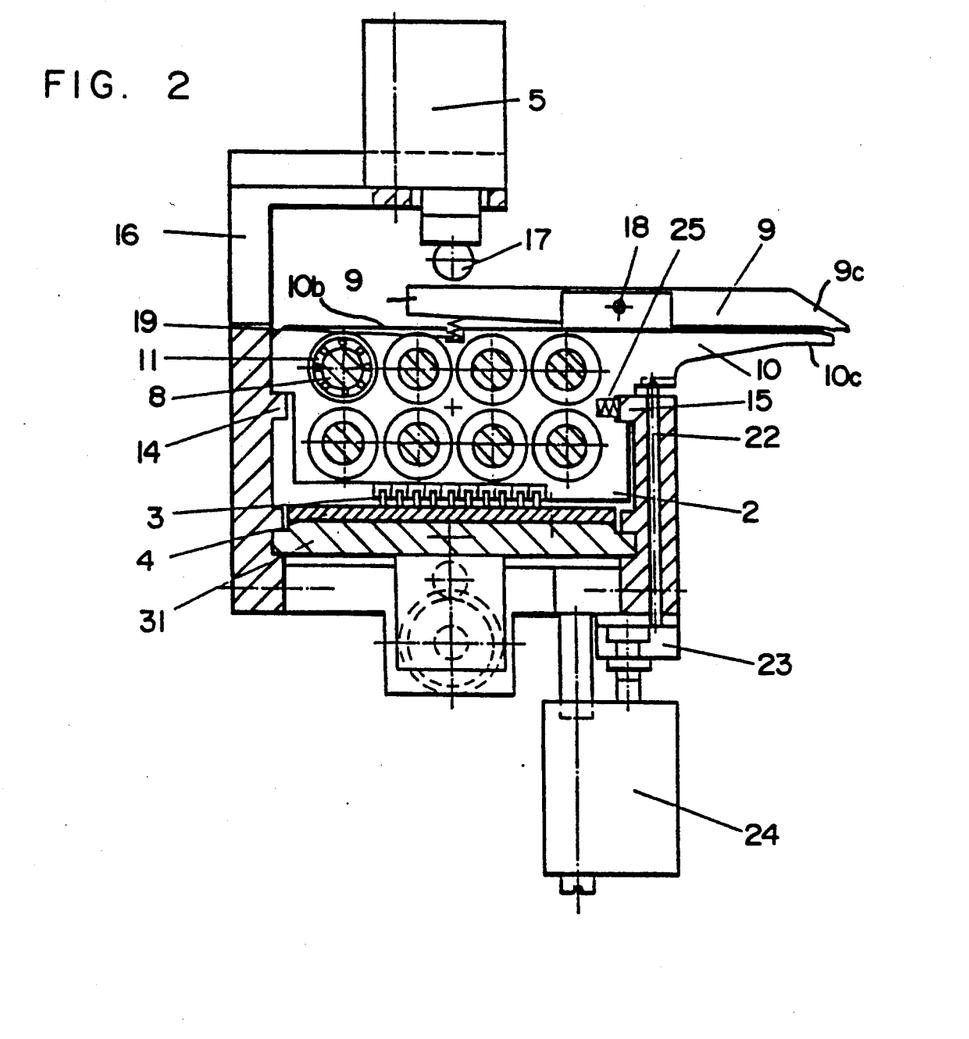
FIG. 2 is an enlarged sectional view of the commonly assigned apparatus depicted in FIG. 1.

Turning attention now to FIGS. 1a and 2, the exemplary embodiment of apparatus for receiving and delivering objects, corresponding to the aforementioned commonly assigned apparatus, comprises a carrier or support member 6 upon which there are arranged, between two supports 7a and 7b, a plurality of guide columns or posts 8 which extend substantially parallel to one another. These guide columns or posts 8 serve as guides for each of a plurality of displaceable object carriers or supports 1a, here, for instance, constituted by clamps or tongs 1. Each clamp or clamp member 1 comprises an upper clamp jaw 9 and a lower clamp jaw 10. Each such lower clamp jaw 10 is provided with a guide sleeve or bushing 11 containing a suitable ball bearing or the like and through which piercingly extends an associated one of the guide columns or posts 8. In the embodiment under consideration, the clamps 1 are designed to be quite narrow, so that for stability reasons the guide sleeves 11 extend somewhat past both sides of the related clamp or clamp member 1, as best seen by referring to FIG. 1a. Notwithstanding such design and in order to enable arranging the individual clamps 1 close to one another, neighboring clamps 1 are guided at different guide columns or posts 8. Furthermore, the guide sleeve 11 of each clamp 1 extends to both sides freely through appropriate bores or openings of each neighboring clamp 1. The thickness of each clamp 1 can be freely selected.

By further referring to FIGS. 1 and 1a, it will be understood and recognized that the lower clamp jaw 10 of each clamp 1 is provided at both ends of the lengthwise extent thereof with a respective cutout or recess 12 and 13 which engage at respective guides or tracks 14 and 15 of the carrier or support 6. Upon displacement of the clamps or tongs 1 such slide along the guides or tracks 14 and 15. As best seen from FIG. 2, a compression or pressure spring 25 or equivalent structure located between the lower clamp jaw 10 and the guide or track 15 ensures that the displacement of the clamps 1 is uniformly accomplished. FIG. 1 depicts all of the clamps or tongs in a starting position without any intermediate space therebetween, the so-called application or mounting region E (see FIGS. 3a and 3b).

All of the clamps 1 located in the application or mounting region E are located beneath a clamp actuation device 5a which will now be considered in greater detail. This clamp actuation device 5a essentially comprises a fluid-operated, for example, pneumatic cylinder unit 5 which acts by means of its non-visible piston upon a pressure rod or bar 17. Upon actuation of the pneumatic cylinder unit 5 the pressure rod or bar 17 acts upon the upper clamp jaws 9 of all of the clamps 1 which are located in the application or mounting region E. The upper clamp jaw 9 of each clamp 1 is seated in a holder or support structure 10a of the associated lower clamp jaw 10 and is rotatably mounted at a shaft or axle 18. With reference to FIG. 2, it will be understood that between the rear part 9a of the upper clamp jaw 9, which in the closed state of the clamp 1 does not bear upon the lower clamp jaw 10, and the rear part 10b of the lower clamp jaw 10 there is inserted a substantially vertically disposed compression or pressure spring 19 or equivalent structure.

Upon opening of the clamp 1 depicted in FIG. 1a, the pressure rod or bar 17 presses against the rear part 9a of the upper clamp jaw 9 against the action of the compression or pressure spring 19. As soon as there is no longer exerted the pressure or pressing action of the pneumatic cylinder unit 5, then due to the action of the compression or pressure spring 19 the clamp 1 automatically assumes its closed position or state. Both of the front ends 9c and 10c of the upper clamp jaw 9 and lower clamp jaw 10, respectively, of each clamp 1 are appropriately configured as a function of the object to be grasped or engaged.

Continuing, and as best observed from FIGS. 1a and 2, the lower clamp jaw 10 of each clamp 1 is provided at the region of its lower lengthwise edge with a positioning or locating marker or mark 2 or equivalent facility which is formed by a lower clamp jaw portion or section 2a which possesses a different length for each one of the clamp jaws 1. In the embodiment depicted in FIG. 1, the forwardmost clamp 1, that is, the first clamp 1 appearing at the left-hand side of the illustration, possesses the shortest lower clamp jaw portion or section 2a. It will be understood that for each successive clamp 1 this lower clamp jaw portion or section 2a is progressively longer by a predetermined amount, so that the rearmost clamp 1 located at the right-hand side of FIG. 1 has the longest lower clamp jaw portion or section 2a.

Furthermore, the carrier or support 6 of the exemplary embodiment of apparatus for receiving and delivering objects depicted in FIG. 1, comprises two spaced projections or shoulders 20a and 20b, each of which contains an associated guide groove or track 20c into which there can be substantially horizontally inserted a displaceable slide or carriage 31. This displaceable slide or carriage 31 is equipped with an exchangeable plate-shaped positioning device 4. The displaceable slide or carriage 31 together with the exchangeable plate-shaped positioning device 4 are appropriately longitudinally displaceable beneath the guide columns or posts 8 in the direction of the clamps 1 by any suitable displacement structure, such as a pneumatic drive, like, for instance, the pneumatic cylinder unit 5 previously considered.

By further referring to FIG. 1, it will be seen that at the top surface of the plate-shaped positioning device 4 there are arranged in a mesh-like pattern or grid a plurality of openings or holes 4a into which there are inserted positioning pins 3. The grid or pattern spacing is coordinated to the dimensions of the different positioning markers 2 of the clamps 1 and to the spacing between the clamps 1. Upon displacement of the slide or carriage 31 within the guides 20c, each positioning pin 3 inserted into the plate-shaped positioning device 4 impacts against the associated positioning marker 2, whereupon the related clamp and any further clamps 1 located directly therebehind—in the arrangement of FIG. 1 such would be the clamps 1 located at the right of the clamp 1 whose positioning marker 2 has been contacted by the associated positioning pin 3—are shifted towards the rear. It will be readily understood the positioning pins 3 can be selectively inserted into desired ones of the pin receiving openings or holes 4a within the predetermined pattern or grid configuration. Hence, by means of the plate-shaped positioning device 4 there can be achieved in a very simple manner a random desired or predetermined arrangement or grouping of the clamps 1 with respect to one another, as also will be further considered shortly.

In order to positionally fix the displaced clamps 1 in the desired attained spatial arrangement, there is provided at the part of the carrier or support 6 containing the guide 15, at each possible clamp position within the application or mounting region E, a substantially vertically extending arresting or locking pin 22 or equivalent structure. All of the arresting pins 22 are attached at their lower ends to a connection element 23 which is operatively connected with a fluid-operated, for example, pneumatic elevation displacement or lifting device 24 (see FIG. 2), so that such arresting pins 22 can be shifted in substantially vertical direction. As soon as the clamps 1 have assumed their desired displaced or shifted position, then the lifting device 24 is activated and, as a consequence, all of the clamps 1 located in the application or mounting region E are positionally fixed in place by the therewith engaging arresting or locking pins 22 or the like.

Of course, in place of the clamps or tongs 1 there also can be used other known object carriers or supports of the form-locking, force-locking or frictional type, such as, for instance, magnetically-operated or vacuum-operated gripper elements.

Figure 3A:
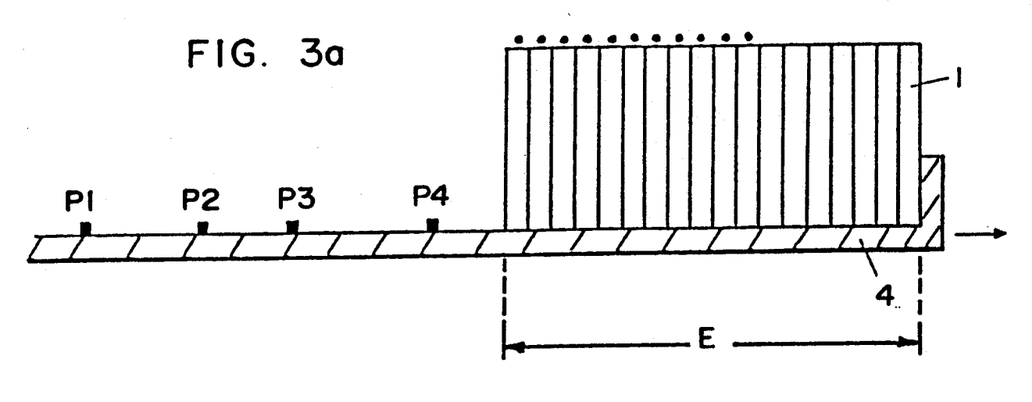
FIGS. 3a and 3b schematically illustrate two respective operating positions of the clamps or tongs of the apparatus depicted in FIGS. 1, 1a and 2 for purposes of explaining the operation thereof.
Figure 3B:
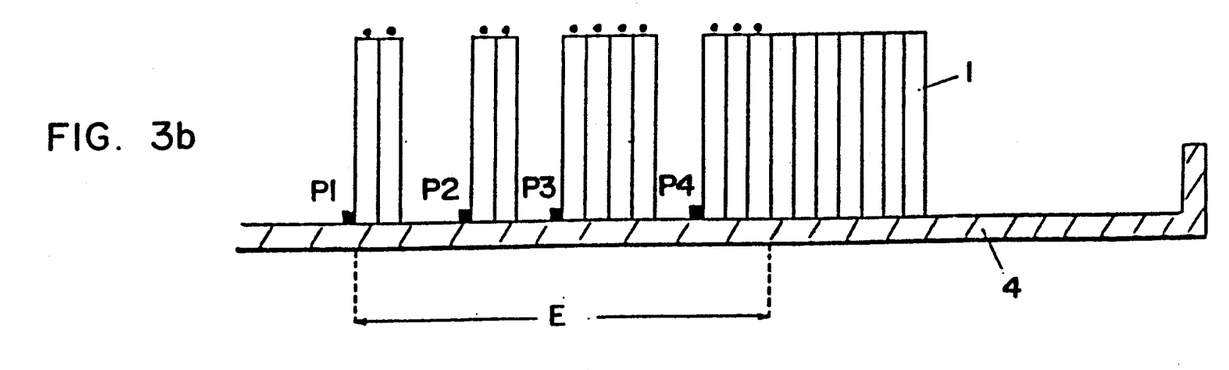

With reference to FIGS. 3a and 3b there will now be considered the operation or function of the apparatus described previously with respect to FIGS. 1a and 2 based upon a practical example relating to the use of such apparatus for fitting plug and socket connectors with contacts or contact elements, that is, for instance, with contact pins or blades. It is firstly noted that FIG. 3a depicts the starting condition of the apparatus. It will be seen therefrom that, by way of example, the total number of available clamps 1 amounts to eighteen, all of which are initially located at the application or mounting region E. This number of clamps 1 thus corresponds to the maximum number of connection pin positions which can be simultaneously mounted or fitted. As will best be understood by referring to FIG. 3b, the contemplated pattern for the contact row which is to be fitted with contact pins or the like containing eighteen contact pin positions, starting from the right side of the application or mounting region E of such FIG. 3b, is as follows: 3 contacts, followed by 2 empty position followed by 4 contacts, followed by 2 empty positions, followed by 2 contacts, followed by 3 empty positions, followed by 2 contacts. Therefore, it will be seen that there are to be fitted a total of only eleven contacts or contact pins and predetermined intermediate positions are to be left free of contacts or contact pins.

In the starting position the plate-shaped positioning device 4 equipped with the positioning pins P1, P2, P3 and P4 arranged according to the desired pattern, has not yet been displaceably inserted. By any suitable and thus here not further illustrated means the apparatus is placed into a position in which the first eleven clamps 1 counted from the left of FIG. 3a, corresponding to the eleven contact positions to be fitted, are located in a position where there can engage the carrier or support delivering the contact elements or pins. Each of the eleven clamps 1 remove a contact element and fixedly retain the same. Those clamps 1 containing the contact elements have been shown in FIG. 3a with a small black dot at their free end.

Thereafter the plate-shaped positioning device 4 equipped with the positioning pins P1, P2, P3 and P4 arranged in the desired pattern is displaceably inserted into the apparatus towards the right of the showing of FIG. 1. Thus, the clamps 1 are shifted to the right in sets or packs as a function of the predetermined arrangement of the positioning pins P1, P2, P3 and P4. As a result, the positioning pin P4 impacts against the positioning marker 4 of the tenth clamp 1 counted from the right side of FIG. 3a, resulting in this tenth clamp 1 together with the nine further clamps 1 located behind such tenth clamp 1 being shifted to the right in FIG. 3a, and specifically, until reaching the position where the seven clamps 1 of this displaced clamp set which do not carry any contact element are now located externally of the application or mounting region E, as the same has been clearly depicted at the right side of FIG. 3b. Thus, it will be seen that only three clamps 1 of the shifted clamp set containing ten clamps 1 remains within the application or mounting region E, and specifically those three clamps 1 containing the contact elements, as previously discussed.

Furthermore, during this shifting of the plate-shaped positioning device 4 the positioning pin P3 impacts against the positioning marker 2 of the fourteenth clamp 1 counted from the right of the showing of FIG. 3a and displaces this clamp 1 together with the three further clamps 1 located therebehind towards the right, into the position depicted in FIG. 3b. In corresponding fashion the other positioning pins P2 and P1 displace their associated clamps 1, so that finally there is realized the arrangement or grouping of the clamps 1 as depicted in FIG. 3b. This clamp arrangement or grouping corresponds to the desired pattern of the contact arrangement at the plug and socket connector.

As will be seen further from the showing of FIG. 3b, all of the clamps carrying a contact element or pin are disposed in the application or mounting region E of the apparatus. This apparatus then can be brought into a position where the contact elements are inserted into the connector body.

In the event that the displaceable object carriers or supports, that is, the clamps 1 insert the contact elements or pins into the connector body by virtue of, for instance, a forward movement of the described fitting tool containing the clamps 1, then there arise considerable forces. In particular, in the presence of an inaccurate relative positioning of the tool with respect to an associated connector body, during insertion of the contact elements or pins there can arise defects at the fitting tool, for instance, deformation or bending of the clamps 1. As previously discussed, the repair of such a damaged fitting tool is very time-consuming and expensive and if there is not available a replacement tool such results in longer downtime of the apparatus. Such drawback can be eliminated with the modified construction of apparatus depicted in FIG. 4.

Figure 4:
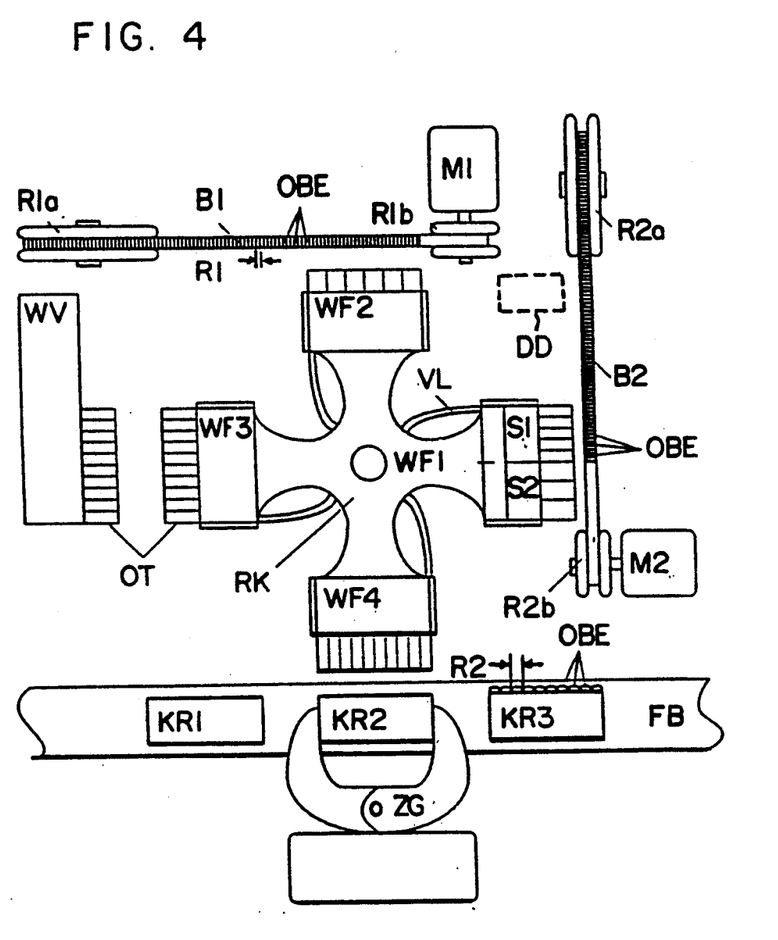
FIG. 4 schematically illustrates a further embodiment of apparatus for receiving and delivering objects and equipped with tools which contain both displaceable and non-displaceable object carriers or supports.

FIG. 4 illustrates an apparatus containing a tool WV which possesses object carriers or supports OT which are transversely displaceable with respect to one another and in principle functions in the manner considered heretofore with reference to the embodiment described on the basis of FIGS. 1, 1a, 2, 3a and 3b. Additionally, there are provided four tools WF1, WF2, WF3 and WF4 containing non-displaceable object carriers or supports OT which are mounted upon a rotatable body member or turret RK. These four tools WF1, WF2, WF3 and WF4 each equipped with the non-displaceable object carriers OT receive objects OBE, such as contact elements or contact pins, from suitable delivery or infeed means, such as bands or belts B1 and B2 or from a here merely generally schematically depicted object dispenser device DD and can deliver such to bodies or body members KR1, KR2, KR3 and so forth, such as connectors to be fitted with the contact elements, which are transported upon a conveyor or infeed band or belt FB. Furthermore, the tools WV and WF1, WF2, WF3 and WF4 are displaceable relative to one another such that objects OBE can be exchanged between the respective object carriers OT of both types of tools WV and WF1, WF2, WF3 and WF4. At this juncture there will be considered the function of the apparatus of FIG. 4, which is as follows:

The bands or belts B1 and B2 are transferred by means of stepping motors M1 and M2, respectively, or other suitable drives, from the associated spools R1a and R2a to the spools R1b and R2b, respectively. The objects OBE, the contact elements or contact pins for instance, which are present at the bands or belts B1 and B2, for example, in a first grid or pattern spacing, such as generally indicated at R1, are received in a predetermined number by the tools WF1, WF2, WF3 and WF4 whose object carriers OT are arranged in the same grid or pattern spacing R1, and transferred to the tool WV or else pressed directly into the openings of the bodies KR1, KR2, KR3 and so forth, like the connector bodies, having a grid or pattern spacing R2. During such pressing-in operation the bodies KR1, KR2, KR3 and so forth are positioned and fixedly held in place by a position fixing device or clamp ZG. Objects OBE which are received by one of the tools WF1, WF2, WF3 and WF4 and first transferred to the tool WV are placed at the desired pattern spacing with respect to one another by displacing the displaceable object carriers or supports OT thereof, for example the clamps, and subsequently transferred back to one of the tools WF1, WF2, WF3 and WF4. In the event the pattern spacings R1 and R2 are of the same size, then the objects OBE can be delivered from the same tool WF1, WF2, WF3 or WF4 to the tool WV and again received therefrom. Additionally, there exists the possibility of arranging a further band or object supply structure in such a manner that the tool WV, for instance, following a rotational or indexing movement, receives objects OBE directly from this band or the like.

The mounting of, for example, six objects OBE, such as contact elements in a predetermined pattern in a body, like the bodies or body members KR1, KR2, KR3 and so forth, for example, in the insulating body of a connector, is accomplished in the following manner:

The band B1 is advanced by six increments or steps by means of the associated stepping motor M1. Six objects OBE are engaged or grasped by, for example, the tool WF3, whose object carriers or supports OT have the same pattern spacing as, or a pattern spacing which is smaller by an integer multiple of, the pattern spacing R1 of the objects OBE located upon the band B1. After rotation of the rotatable body or turret RK through an angle of about 90° the grasped objects OBE are delivered to the displaceable object carriers or supports OT of the tool WV. This tool WV performs the desired displacement or shifting of its object carriers or supports OT, so that the six object carriers OT with their objects OBE are thereafter located in positions corresponding to the required pattern.

In the event the pattern spacing of the object carriers or supports OT of the tool WF3 is the same as the pattern spacing R2 of the openings of the bodies KR1, KR2, KR3 and so forth or is smaller than such pattern spacing of the openings of the bodies KR1, KR2, KR3 and so forth by an integer multiple, that is to say, in the event the pattern spacings R1 and R2 are of the same size or differ from one another by an integer multiple, the tool WF3 takes-up the objects OBE in the newly oriented pattern and following a further 90° rotation of the rotatable body or turret RK inserts such into the openings of an associated body KR1, KR2, KR3 and so forth.

In the event the pattern spacing of the object carriers or supports OT of the tool WF3 and the openings of the bodies KR1, KR2, KR3 and so forth do not coincide and the pattern spacings R1 and R2 also do not coincide with an integer multiple, then the objects OBE are taken over by a further tool WF2 whose object carriers or supports OT exhibit the required pattern spacing R2 or a smaller pattern spacing which is an integer multiple thereof, then received by the tool WV and inserted.

It is furthermore possible to use a tool, like the tool WF1 whose object carriers or supports OT are subdivided into at least two regions or zones S1 and S2 having different pattern spacings which correspond to the pattern spacings R1 and R2 of the objects OBE, that is the openings thereof, and which objects OBE are arranged upon the bands B1 and B2 or are smaller than such pattern spacings R1 and R2 by an integer multiple. In this case, the objects OBE are removed from the band B1, for instance, by the tool WF1 and the object carriers or supports OT thereof located at the region S1, transferred to the tool WV and then again removed by the tool WF1 by means of the object carriers or supports OT thereof located at the region S2 and inserted into the openings of the bodies KR1, KR2, KR3 and so forth.

If, with the same size pattern spacing R1 and R2, there is desired a complete fitting of the bodies or body members KR1, KR2, KR3 and so forth, then, for instance, the tool WF3 removes a requisite number of objects OBE from one of the bands B1 or B2 and places such, without any intermediate transfer to the tool WV, directly into one of the bodies KR1, KR2, KR3 and so forth. Since the object carriers OT of the tools WF1, WF2, WF3 and WF4 are non-displaceable they can be advantageously formed of one-piece or integrally to form a unit, as schematically depict for the tool WF4, resulting in an additional increase of its mechanical loadability. The displacement and operation of the tools WF1, WF2, WF3 and WF4 and WV can be accomplished, for example, electrically or pneumatically. For the operation of the tools WF1, WF2, WF3 and WF4 upon the rotatable body or turret RK there are provided suitable supply lines or conduits VL. Of course, it is possible to also operate the tools WV, WF1, WF2, WF3 and WF4 by suitable drive devices which are independent of the rotatable body o turret RK.

Apart from the use of the described infeed or delivery devices containing the bands B1 and B2 there also can be used a dispensing device, like the dispensing device DD, which places a predetermined number of objects OBE, possibly arriving in an unorderly fashion or disarray, into a pattern spacing R1 and in a desired number for take-over by the tool WV or one of the tools WF1, WF2, WF3 and WF4. Moreover, the dispensing device DD also can be constructed such that incoming mutually interconnected objects OBE are first singled and then held in a state of readiness for further delivery or outfeed. Therefore, with the described apparatus random desired objects OBE, such as, for instance, electrical or mechanical elements, which are present at random locations in a random pattern, can be delivered in a random identical or different pattern to the most different bodies located at a random position within the access region of the apparatus. As previously mentioned, the pattern resolution of the tools WF1, WF2, WF3 and WF4 is selected such that each desired pattern and each desired arrangement of the objects OBE can be produced. It is also possible to use in the inventive apparatus tools WV exhibiting displaceable object carriers or supports OT which are constructed differently from the apparatus considered with reference to FIGS. 1, 1a, 2, 3a and 3b.

Figure 5:
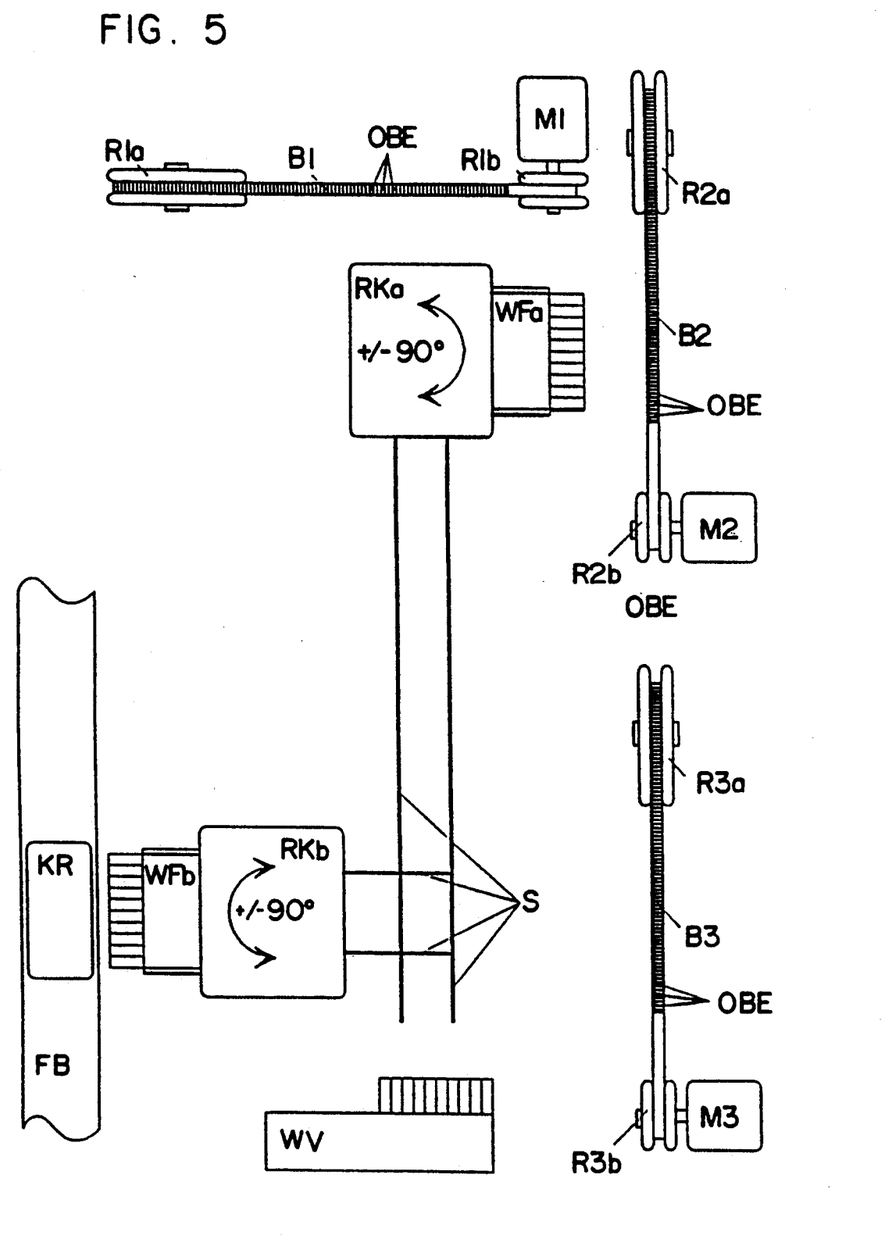
FIG. 5 schematically illustrates a still further embodiment of apparatus for receiving and delivering objects and equipped with tools which are displaceable independently of one another.

With reference now to the modified construction of apparatus as depicted in FIG. 5 and in order to further increase the flexibility or versatility of the apparatus, the depicted tools WFa and WFb can be arranged at different turning bodies, displaceable bodies or rotational bodies. Thus, for example, the tools WFa and WFb serving for the delivery of the objects OBE to the bodies or body members KR, can be arranged upon their own separate rotatable body, such as the rotatable bodies RKa and RKb. In order to render possible the reception of objects OBE from further bands or the like, the rotatable body RKa which is equipped with the tool WFa, can be arranged in a horizontal plane and/or to be vertically displaceable and/or to be rotatable. Therefore, by means of the tool WFa it is possible to take-up or receive objects OBE from three different bands B1, B2 and B3 and to deliver such to a tool WV or to a further tool WFb. This tool WFb, which is arranged upon the further rotatable body or turret RKb, takes over objects OBE from the tool WV or directly from the tool WFa and following an appropriate rotation of the rotatable body or turret RKb inserts these objects OBE into a body KR which is delivered by means of a conveyor band or belt FB. By virtue of such mobility of the rotatable bodies or turrets RKa and RKb moving upon the rails S, it is, of course, possible to deposit the objects OBE by means of the tools WFa and WFb also at different locations. In particular, in the event that the objects OBE are not only received by the tool WFa, rather also inserted thereby, the rotatable body or turret RKa also together with the tool WV can move between the different positions. In the last-mentioned situation, there can be avoided time losses or dead time due to return movements to the tool WV.

While there are shown and described present preferred embodiments of the invention, it is distinctly to be understood the invention is not limited thereto, but may be otherwise variously embodied and practiced within the scope of the following claims.

What is claimed is:

1. An apparatus for receiving of objects arranged in a first pattern and delivering such objects arranged in a second pattern, said objects being contact elements, said apparatus comprising:
    at least one infeed device for transporting objects arranged in the first pattern to the receiving location;
    means for infeeding body members to which there can be delivered the objects arranged in the second pattern;
    at least one tool equipped with mutually non-displaceable object carriers for receiving, fixedly holding and delivering object, said object carriers being clamps;
    at least one tool equipped with mutually displaceable object carriers for receiving, fixedly holding and delivering objects, said object carriers being clamps;
    the at least one tool equipped with mutually displaceable object carriers serves for picking-up objects from at least one receiving location;
    the at least one tool equipped with mutually non-displaceable object carriers serves for picking-up objects from the at least one tool equipped with the mutually displaceable object carriers and inserting said contact elements into said body members.

2. The apparatus according to claim 1, further including:
    a dispensing device for manipulating the objects in such a manner that the objects are prepared for delivery individually in the first pattern and in a desired number; and
    means for infeeding body members to which there can be delivered the objects arranged in the second pattern.

3. The apparatus according to claim 1, wherein:
    the first and second patterns of the objects have the same pattern spacings; and
    the object carriers of the at least one tool provided with mutually non-displaceable object carriers are arranged at a pattern spacing which is smaller by an integer multiple of the pattern spacings of the first and second patterns.

4. The apparatus according to claim 1, wherein:
    the first and second patterns of the objects have different pattern spacings; and
    the object carriers of the at least one tool provided with mutually non-displaceable object carriers are arranged at a pattern spacing which is the same as the pattern spacing of the smaller one of the pattern spacings of the two different pattern spacings.

5. The apparatus according to claim 1, wherein:
    the first and second patterns of the objects have different pattern spacings; and
    the at least one tool provided with mutually non-displaceable object carriers comprises at least two regions containing object carriers which are respectively arranged at the two different pattern spacings.

6. The apparatus according to claim 1, wherein:
the first and second patterns of the objects have different pattern spacings; and
the at least one tool provided with mutually non-displaceable object carriers comprises at least two regions containing object carriers which are arranged in a pattern spacing which is smaller than the different pattern spacings by a predetermined multiple.

7. The apparatus according to claim 1, wherein:
the first and second patterns of the objects have different pattern spacings;
at least two of said tools equipped with mutually non-displaceable object carriers;
the mutually non-displaceable object carriers of one of said at least two tools being arranged at one of the different pattern spacings; and
the mutually non-displaceable object carriers of the other one of said at least two tools being arranged at the other one of the different pattern spacings.

8. The apparatus according to claim 1, wherein:
the first and second patterns of the objects have different pattern spacings;
at least two of said tools equipped with mutually non-displaceable object carriers; and
the mutually non-displaceable object carriers of one of said at least two tools being arranged at a pattern spacing which is smaller than the different pattern spacings by a predetermined multiple.

9. The apparatus according to claim 1, wherein:
means for movably mounting the tools between the receiving locations as well as between at least one of the receiving locations and the at least one tool equipped with mutually displaceable object carriers and at least with respect to one delivery location.

10. The apparatus according to claim 1, wherein:
the object carriers of the at least one tool equipped with mutually displaceable object carriers form a one-piece unit.

11. The apparatus according to claim 1, further including:
at least one means serving for the reception and delivery of body members equipped with the objects.

12. The apparatus according to claim further including:
at least one movable means at which there is arranged at least one of the tools.

13. The apparatus according to claim 12, wherein:
the at least one movable means comprises a turret means.

14. The apparatus according to claim 1, further including:
a respective movable means at which there is arranged each one of the tools.

15. The apparatus according to claim 14, wherein:
each of the respective movable means comprises a turret means.

16. An apparatus for receiving contact elements arranged in a first pattern and delivering such contact elements arranged in a second pattern, comprising:
at least one tool means equipped with mutually non-displaceable clamps for receiving, holding and re-delivering contact elements;
at least one tool means equipped with mutually displaceable clamps for receiving, holding and re-delivering contact elements;
the at least one tool means equipped with mutually displaceable clamps being structured for directly receiving contact elements from at least one receiving location;
the at least one tool means equipped with mutually non-displaceable clamps being structured for directly receiving said contact elements from the at least one tool means equipped with the mutually displaceable clamps and inserting said contact elements into body members.

17. A method of handling objects arranged in a first pattern and delivering such objects arranged in a second pattern, said objects being contact elements, said apparatus comprising the steps:
infeeding the objects arranged in the first pattern selectively to at least any one of (1) at least one tool equipped with mutually non-displaceable clamps for receiving, fixedly holding and re-delivering the objects, and (2) at least one tool equipped with mutually displaceable clamps for receiving, fixedly holding and re-delivering the objects;
transposing the objects arranged int eh first pattern by at least one of the tools into objects arranged in the second pattern; and
mounting the objects arranged int he second pattern in a body.

18. The method according to claim 17, wherein:
said body is an insulting body of a plug and socket connector.

* * * * *